Aug. 4, 1959 B. D. LOUGHLIN 2,898,454

FIVE ZONE COMPOSITE TRANSISTOR WITH COMMON ZONE GROUNDED TO PREVENT INTERACTION

Filed Jan. 22, 1957 2 Sheets-Sheet 1

United States Patent Office 2,898,454

Patented Aug. 4, 1959

2,898,454

FIVE ZONE COMPOSITE TRANSISTOR WITH COMMON ZONE GROUNDED TO PREVENT INTERACTION

Bernard D. Loughlin, Huntington, N.Y., assignor to Hazeltine Research, Inc., Chicago, Ill., a corporation of Illinois Application January 22, 1957, Serial No. 635,331

18 Claims. (Cl. 250—20)

GENERAL

The present invention is directed to signal-translating systems and, more particularly, to such systems which employ multiple-unit transistor devices. While signal-translating systems of the type just mentioned have a variety of applications, they are particularly useful in radio equipment such as radio receivers. To that end, they have utility wherein the individual units may serve as portions of cascade-connected amplifiers, converter intermediate-frequency amplifier stages, intermediate-frequency audio-frequency amplifier stages, and various other combinations of stages for a radio receiver. As employed in the text and the claims, the term "signal-translating system" is intended to denote any one of various combinations of stages such as those mentioned above regardless of whether the signals translated by the individual stages lie in the same or widely different frequency ranges.

The use of transistors in radio receivers is becoming more widespread. The usual transistorized receiver marketed today ordinarily includes six transistors, one in the converter or oscillator-modulator stage, one in each of the two intermediate-frequency amplifier stages, another in the audio-frequency driver stage, and two in the push-pull audio-frequency output stage. Transistors are presently more costly than electron tubes and, despite their outstanding advantages over electron tubes for many applications, this cost has prevented the wider manufacture of transistorized radio receivers.

In copending application Serial No. 567,278, filed February 23, 1956, in the names of Richard J. Farber and Alexander Proudfit, there is described and claimed a cascade-connected transistor signal-translating system which may be in the form of a two-stage intermediate-frequency amplifier that makes use of the multiple-unit junction transistor. The multiple-unit transistor comprises an integral stack of five semiconductive layers, alternate ones of which are of the opposite conductivity type. The third or middle layer serves not only as the collector for the first transistor but also as the emitter for the second transistor, thereby eliminating the need for external conductive connections therebetween. The first transistor is connected in the common emitter configuration, the emitter being grounded for alternating-current signals, and the second transistor is connected in the common base configuration, that base also being at ground potential. While such an amplifier is economical because of the use of a multiple-unit transistor which affords excellent isolation between the input and output circuits thereof because of its inherent neutralization, it does not afford as much gain as is often desired.

While multiple-unit transistors are less costly than two conventional transistors, they have not appeared to be desirable in various circuit applications in radio receivers because it has not been known how to promote the full use of the capabilities of those circuits.

It is an object of the invention, therefore, to provide a new and improved signal-translating system employing junction transistors which avoids one or more of the above-mentioned disadvantages and limitations of prior such systems.

It is another object of the invention to provide a new and improved signal-translating system employing a multiple-unit transistor device.

It is a further object of the invention to provide a new and improved repeater system employing a multiple-unit transistor device which is capable of affording the gain of a repeater system employing two independent transistors connected in cascade.

It is also an object of the present invention to provide a new and improved signal-translating system employing a multiple-unit junction transistor device wherein the transistors thereof are employed in at least two different circuits which are capable of operating independently of each other with respect to alternating-current signals in those circuits.

It is an additional object of the invention to provide a new and improved signal-translating system employing a multiple-unit junction transistor device wherein the transistors thereof are employed in at least two different circuits which operate in widely different frequency ranges.

It is a still further object of the invention to provide for use in a transistorized radio receiver a new and improved signal-translating system which is capable of reducing the cost of such a receiver.

In accordance with a particular form of the invention, a signal-translating system comprises a multiple-unit transistor device including a pair of junction transistors which have a common zone of semiconductive material serving as the collector of one transistor and as the emitter of the other transistor, an electrical connection being made to such common zone. The signal-translating system also includes a first signal-translating circuit including one of the transistors and a second signal-translating circuit including the other thereof. The circuits just mentioned are of the common emitter type to promote full use of the capabilities of those circuits. The system further includes means in the aforesaid circuits and engaging the above-mentioned connection for maintaining the aforesaid common zone at a point of fixed potential for at least alternating-current signals translated by the circuits, thereby providing desired independent operation of the first and second circuits with respect to alternating-current signals in each of them.

For a better understanding of the present invention, together with other and further objects thereof, reference is had to the following description taken in connection with the accompanying drawings, and its scope will be pointed out in the appended claims.

Referring to the drawings.

Figure 1:
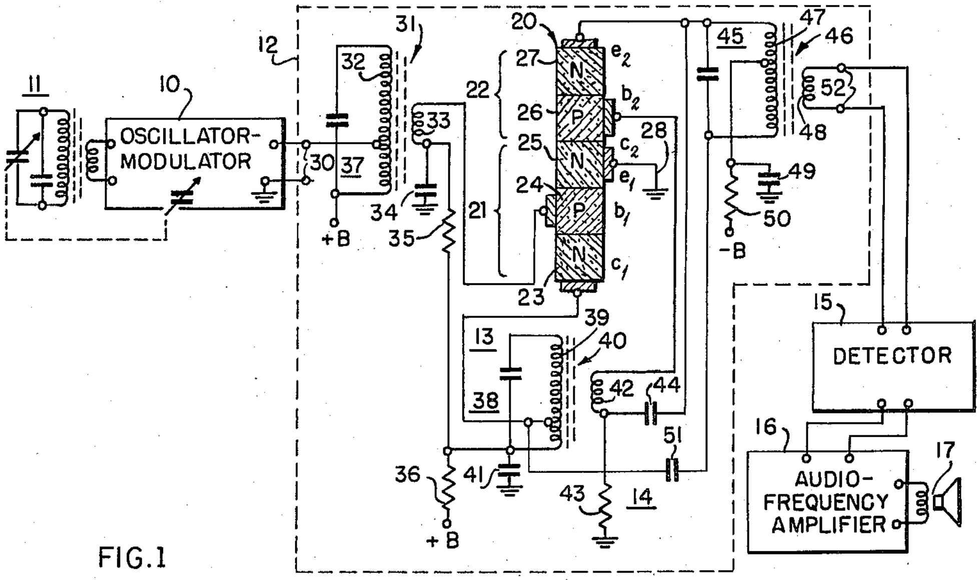
Fig. 1 is a circuit diagram, partly schematic, of a complete radio broadcasting receiver which includes a signal-translating system embodying the present invention in a particular form.

*General description of Fig. 1 Receiver*

Referring now to Fig. 1 of the drawings, there is represented a complete radio broadcast receiver which utilizes a signal-translating system embodying a particular form of the present invention. In general, the receiver includes a frequency converter or oscillator-modulator 10 having a received wave-signal input circuit constituting an antenna system such as one commonly referred to in the art as a "ferrite rod antenna" 11 and having its output circuit coupled to an intermediate-frequency amplifier system 12 of one or more stages. The intermediate-frequency amplifier system, which constitutes a signal-translating system in accordance with the present invention and will be described in detail subsequently, includes a pair of cascade-connected stages 13 and 14 which are, in turn, connected in cascade with a modulation-signal detector 15, an audio-frequency amplifier 16, and a sound-reproducing device 17. While the detector 15 may be one of the type for deriving the modulation-signal components of an amplitude-modulation wave signal or one for deriving the modulation-signal components of a frequency-modulation wave signal, for the purpose of describing a particular embodiment of the invention it will be considered to be a detector for amplitude-modulated wave signals.

It will be understood that the units 10, 11, 15, 16, and 17 just described may be of conventional construction and operation, the details of which are well known in the art, so that further detailed description and explanation of the operation thereof are unnecessary.

*General operation of Fig. 1 Receiver*

Considering briefly the operation of the Fig. 1 receiver as a whole, but neglecting for the moment the details of the operation of the intermediate-frequency amplifier system 12 which will be explained subsequently, the desired amplitude-modulated wave signal intercepted by the antenna 11 is applied to the oscillator-modulator 10 and is converted by the latter to an amplitude-modulated intermediate-frequency wave signal which is translated by the output circuit of unit 10 to the cascade-connected intermediate-frequency stages 13 and 14 for amplification therein. The output signal of the intermediate-frequency amplifier stage 14 is applied to the detector 15 which derives the audio-frequency modulation components of the received wave signal. These components are, in turn, amplified by the audio-frequency amplifier 16 and are reproduced by the sound-reproducing device 17 in a conventional manner.

*Description of intermediate-frequency amplifier system 12 of Fig. 1*

The signal-translating or intermediate-frequency amplifier system 12 of Fig. 1 comprises a multiple-unit transistor device 20 including a pair of junction transistors 21 and 22 which have a common zone 25 of semiconductive material and an electrical connection 28 thereto. In accordance with a particular embodiment of the invention, the device 20 is of the grown-junction type comprising a unitary body of semiconductive material arranged in a predetermined pattern of five zones. More particularly, the multiple-unit transistor device 20 includes five successive zones, contiguous ones of which are of the opposite conductivity type. To this end, the device includes in the order named a zone 23 of the N conductivity type and zones 24–27, inclusive, of alternately opposite conductivity types, as represented. It will be understood, however, that the device 20 may be of the PNPNP conductivity type and as such would require biasing of the opposite polarity from that represented in the drawings. Zones 23, 24, and 25 comprise, respectively, the collector, base, and emitter of the first transistor 21, while zones 25, 26, and 27 comprise the collector, base, and emitter, respectively, of the second transistor 22.

The system 12 comprises the first signal translating or intermediate-frequency amplifier circuit 13 including the transistor 21, and further comprises in cascade with circuit 13 the second signal-translating or intermediate-frequency amplifier circuit 14 including the transistor 22. The circuit 13 includes a signal input circuit which is coupled between the base 24 and the emitter 25 of transistor 21. This input circuit includes a transformer 31 having its tuned primary winding 32 connected through a pair of input terminals 30, 30 to the oscillator-modulator 10 and having one terminal of its secondary winding 33 connected to the base zone 24 while its other terminal is connected to the grounded emitter 25 through a coupling condenser 34. The output circuit of the first intermediate-frequency amplifier circuit 13 is connected between the collector 23 and the grounded emitter 25 of transistor 21. The collector 23 is coupled to the emitter 25 through a portion of a winding 39 and an intermediate-frequency by-pass condenser 41 that has one of its terminals grounded. Winding 39 is the primary winding of an interstage transformer 40 which couples the output circuit of amplifier circuit 13 to the input circuit of amplifier circuit 14. A condenser forms with winding 39 a tuned circuit 38 resonant at the desired intermediate frequency. Unidirectional biasing potentials for the transistor 21 are supplied by a source +B which is connected to the collector 23 through a resistor 36 and the aforesaid portion of winding 39 and also is connected to the base 24 through resistors 36 and 35 and the winding 33.

The input circuit of amplifier circuit 14 includes the secondary winding 42 of transformer 40, one terminal of which is connected directly to the base 26 of transistor 22 while the other terminal thereof is connected to the emitter 27 through a condenser 44 and to ground through a resistor 43. Transistor 22, which is connected in the common emitter relation, has a resonant output circuit 45 which includes the primary winding 47 of a transformer 46. One terminal of winding 47 is connected directly to the emitter 27 and a tap on that winding is connected to the grounded collector 25 through a by-pass condenser 49. The other terminal of winding 47 is connected through a neutralizing condenser 51 to the described intermediate point in the winding 39. Energizing potentials for the transistor 22 are supplied by a source −B which is connected to the tap on winding 47 through a resistor 50. The secondary winding 48 of output transformer 46 is connected through a pair of output terminals 52, 52 to the detector 15.

Figure 2:
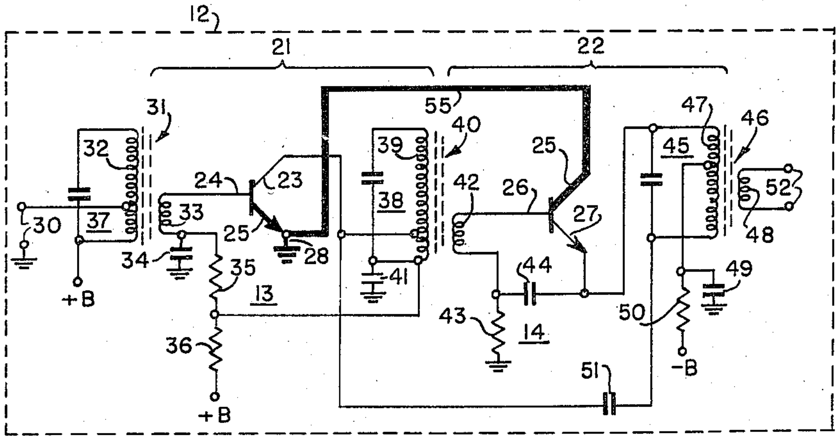
Fig. 2 is a schematic circuit diagram of the signal-translating system represented in Fig. 1.

The circuit diagram of Fig. 2 is virtually identical with that of the intermediate-frequency amplifier system 12 represented in Fig. 1 and differs therefrom only in that the transistors are represented in the more conventional manner to facilitate the understanding. The dark heavy line 55 represents the "built-in" connection between the emitter of transistor 21 and the collector of transistor 22 created by the common zone 25 shown in Fig. 1.

*Operation of amplifier system 12 of Figs 1 and 2*

In considering the operation of the amplifier system 12, it will be assumed initially that the sources +B and −B and the various resistors including resistors 35, 36, 43, and 50 develop the correct operating potentials for the transistors 21 and 22. An intermediate-frequency wave signal derived by the oscillator-modulator 10 is resonated in the tuned input circuit 37 of the transformer 31 and is applied by its secondary winding 33 between the base of the transistor 21 and its emitter 25 which is grounded for unidirectional and intermediate-frequency wave signals. In a well-known manner, the applied signal is translated with a power gain to the collector 23 in the output circuit of transistor 21. The emitter 25 also serves as the collector of transistor 22 and the output signal of transistor 21 is applied by way of transformer 40 to the emitter-base input circuit of transistor 22 wherein it undergoes a further power gain and is delivered by the collector 25 to emitter 27 circuit to the tuned circuit 45 for translation by transformer 46 to the output terminals 52, 52.

The circuits of amplifiers 13 and 14 are of the common emitter type and therefore afford a greater power gain than would similar circuits of the common collector or the common base type. Accordingly, the transistor signal-translating circuits of unit 12 may be said to be of a configuration which promotes full use of the capabilities of those circuits. The arrangement of the circuits of amplifiers 13 and 14 wherein the zone 25 which is common to both circuits is grounded results in an extremely important advantage in that independent operation of the two circuits with reference to signals appearing therein is achieved. In addition to the large over-all power gain realized by the cascaded intermediate-frequency amplifier stages as a result of the use of the common emitter circuit configurations, a material saving in manufacturing costs may be realized because of the use of multiple-unit junction transistor devices. Such devices presently cost about 70% of the cost of two transistors. Indications are that mass production of such multiple-unit devices will result in an even lower cost which will further increase the desirability of employing multiple-unit transistors in radio receiver circuits.

Figure 3:
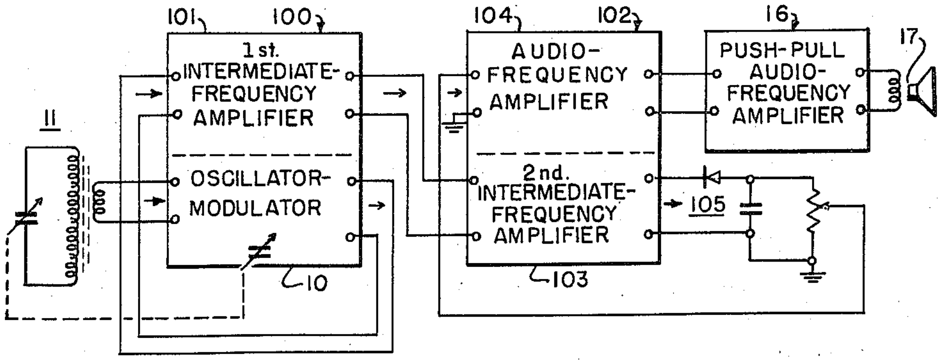
Fig. 3 is a block diagram of a radio receiver employing a pair of signal-translating systems in accordance with other embodiments of the present invention.
Figures 4, 5:
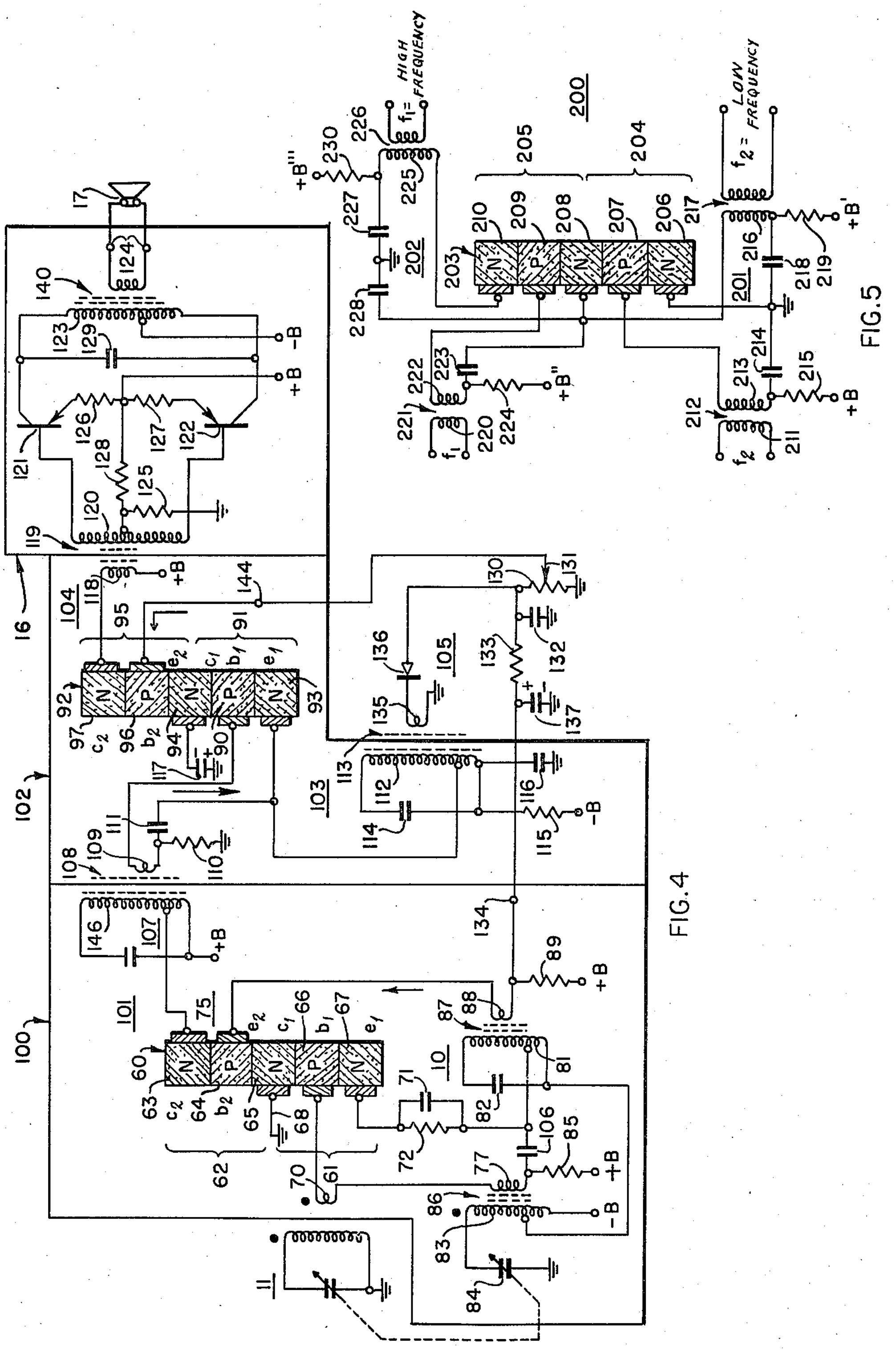
Fig. 4 is a circuit diagram of the receiver represented in Fig. 3.
Fig. 5 is a circuit diagram of another signal-translating system in accordance with the invention.

*Description of radio receiver of Figs. 3 and 4*

The schematic diagram of Fig. 3 presents several other circuit or system combinations which may be realized with multiple-unit transistor devices. Elements in the radio receiver of Fig. 3 corresponding to those of the Fig. 1 receiver are designated by the same reference numerals. The signal-translating system 100 includes a multiple-unit transistor device, to be described in detail in connection with Fig. 4, that functions in the circuits of a cascade-connected oscillator-modulator 10 and first intermediate-frequency amplifier 101. The input circuit of the oscillator-modulator is coupled in a conventional manner to the antenna 11.

The signal-translating system 100 is, in turn, connected in cascade with another signal-translating system 102 which employs a multiple-unit transistor device also represented in Fig. 4. The system 102 includes a second intermediate-frequency amplifier 103 having an input circuit which is coupled to the output circuit of the first intermediate-frequency amplifier 101 and an output circuit which is coupled to a conventional crystal detector 105 that derives the modulation components of the applied intermediate-frequency signal. The detector 105 is connected to the input circuit of an audio-frequency amplifier 104 having an output circuit coupled to another suitable audio-frequency amplifier such as a push-pull amplifier 16.

Referring now to Fig. 4, the antenna 11 is inductively coupled to a winding 70 which is connected in series with a winding 77 between the base 66 of a transistor 61 of the multiple-unit transistor device 60 and the emitter 67 thereof through coupling condensers 106 and 71. Zone 65 of device 60, which serves not only as the collector of transistor 61 but also as the emitter of the other transistor 62 of that device, is conductively connected to ground by way of connection 68. A source of biasing potential +B is connected through a resistor 85 and the windings 77 and 70 to base 66 of transistor 61. A source of potential —B is connected to one terminal of a winding 83 which is tuned to a selected local oscillator frequency by means of an adjustable condenser 84 having one of its terminals grounded. Windings 83 and 77 are respectively the primary and secondary windings of a transformer 86. An intermediate point on winding 83 is connected to one terminal of a winding 81 which is tuned to the desired intermediate-frequency signal by means of a condenser 82. An intermediate point on the winding 81 is connected to the junction of the condensers 106 and 71 and the latter has a biasing resistor 72 connected in parallel therewith. The circuit just described constitutes the frequency converter or oscillator-modulator 10 of system 100 and it will be seen that the transistor 61 of the oscillator-modulator is of the common emitter type and hence is capable of promoting full use of the capabilities of that circuit.

The winding 81 is the primary winding of an interstage transformer 87 and the secondary winding 88 thereof supplies the intermediate-frequency signal derived by the oscillator-modulator 10 to the base and grounded emitter of the transistor 62 of the intermediate-frequency amplifier 75 of unit 100. To this end, one terminal of the winding 88 is connected to ground for alternating currents through a terminal 134 and a filter condenser 137, while the other terminal is connected directly to the base 64 of the transistor 62 of amplifier 75. The output signal derived between the collector 63 and the grounded emitter 65 of amplifier 75 is applied by the collector to an intermediate point on a primary winding 146 of a transformer 108, that winding being tuned to the desired intermediate frequency by a suitable condenser. When transformer 108 is layer wound rather than bifilar wound, capacitance to ground is minimized and this in turn minimizes external feedback from the collector 63 of transistor 62 to its base 64 through that capacitance. It will be seen that the transistor 62 of the amplifier 75 is connected in the common emitter configuration.

The output transformer 108 supplies intermediate-frequency signals by way of its secondary winding 109 to a second intermediate-frequency amplifier 103. One terminal of winding 109 is connected directly to the base 90 of a transistor 91 of semiconductive device 92 while its other terminal is connected through coupling condenser 111 to the emitter 93 of that transistor. Zone 94, which serves as the collector of the transistor 91 and as the emitter of transistor 95 of the multiple-unit transistor device 92, is connected to ground through an audio-frequency and intermediate-frequency by-pass condenser 117. One terminal of the condenser 111 is connected to ground through a resistor 110 while its other terminal is connected to an intermediate point on the primary winding 112 of a transformer 113, which winding is tuned to resonate at the desired intermediate frequency by a condenser 114. One terminal of the winding 112 is connected to ground for alternating currents through a bypass condenser 116 and is also connected to a source of biasing potential —B through a resistor 115. The common emitter circuit of the transistor 91 just described constitutes the second intermediate-frequency amplifier 103 of the receiver of Fig. 4.

One terminal of the secondary winding 135 of the intermediate-frequency output transformer 113 is connected to ground, while its other terminal is connected through a crystal rectifier 136 to the load impedance of the modulation-signal detector 105. The parallel combination of the condenser 132 and the voltage divider 130 constitutes this load impedance. An audio-frequency filter comprising resistor 133 and condenser 137 are connected across the load impedance and are also connected to the terminal 134 for supplying an automatic-gain-control potential to the base 64 of the transistor 62 of the intermediate-frequency amplifier 75. A small forward bias is applied to the base 64 of amplifier 75 by a source +B connected to ground through a resistor 89, terminal 134, resistor 133, and voltage divider 130.

The adjustable tap 131 on the voltage divider 130 is connected through an input terminal 144 to the base 96 of transistor 95 of system 102 so that audio-frequency input signals are applied to transistor 95 between its base 96 and its emitter 94 which is at ground potential for those signals. Amplified audio-frequency output signals developed between the collector 97 and the emitter 94 of the transistor 95 are applied by way of a transformer 119 to the input circuit of the push-pull audio-frequency amplifier 16. To this end, the primary winding 118 of transformer 119 has one terminal connected to the collector 97 and its other terminal connected to a source +B. The terminals of the secondary winding 120 of transformer 119 are connected directly to the base electrodes of transistors 121 and 122, and the intermediate point of that winding is connected to ground through a resistor 125. The respective emitters of the transisors 121 and 122 are connected to a source +B through resistors 126 and 127. The source +B is also connected through a resistor 128 to the intermediate point of winding 120. The parallel combination of a condenser 129 and a primary winding 123 of a transformer 140 are connected between the collectors of the transistors 121 and 122. The secondary winding of transformer 140 is connected through a pair of output terminals 124 to the loudspeaker 17 as represented.

*Operation of Fig. 4 radio receiver*

Received radio-frequency wave signals selected by the antenna 11 are applied by the windings 70 and 77, the condenser 106, and the condenser 71 between the base 66 and the emitter 67 of the transistor 61 of the oscillator-modulator 10. The latter functions as an autodyne frequency converter and local oscillations developed in the tuned circuit 83, 84 are heterodyned with the received wave signal to develop by virtue of the non-linear signal-translating characteristic of transistor 61 the desired intermediate-frequency wave signal in the tuned circuit 81, 82. This signal is applied between the emitter and the base of transistor 62 by winding 88 of inter-stage transformer 87, the filter condenser 137, and the grounded connection 68 and there is developed with power gain across the tuned circuit 107 connected to the collector 63 an intermediate-frequency output signal. The latter is applied by the winding 109 and condenser 111 between the emitter 93 and the base 90 of transistor 91 of the second intermediate-frequency amplifier 103. An amplified intermediate-frequency output signal is developed across the resonant circuit 112, 114 for application by the winding 135 to the crystal rectifier device 136 which derives across its load impedance 130, 132 the modulation components of the received wave signal. A unidirectional gain-control potential derived by the filter network 133, 137 is applied by way of the terminal 134 to the base 64 of transistor 62 of the first intermediate-frequency amplifier 75 and is effective to maintain amplitude of the signal input to the detector 105 within a relatively narrow range for a wide range of received signal intensities.

A selected portion of the derived audio-frequency signal is applied by tap 131 to the emitter-base circuit of the transistor 95. The applied signal receives a power gain and the collector 97 supplies an amplified signal to the winding 118 of transformer 119 for application to the push-pull amplifier 16. A power gain is afforded by this amplifier in the well-known manner and the output signal of the latter is applied to the loudspeaker 17 wherein it is converted to sound.

The signal-translating systems 100 and 102 of Fig. 4 are characterized by their adequate over-all power gain which is afforded by the cascaded stages connected in the common emitter configuration, by effective isolation for signal currents in the various portions of the multiple-unit transistor devices so that independent operation of the various circuits thereof with respect to those signals results, and by a material saving in manufacturing costs which results because of the use of multiple-unit junction transistor devices.

A superheterodyne radio broadcast receiver embodying signal-translating systems in accordance with the Fig. 4 embodiment of the receiver and found to have practical utility included the following circuit constants:

| | |
|---|---|
| Resistors 72 and 115 | 1 kilohm. |
| Resistor 89 | 68 kilohms. |
| Resistor 110 | 220 kilohms. |
| Resistor 125 | 1.5 kilohms. |
| Resistors 126 and 127 | 10 ohms. |
| Resistor 128 | 47 ohms. |
| Resistor 130 | 2.5 kilohms (max.). |
| Resistor 133 | 1.8 kilohms. |
| Condensers 71, 106, 111, 132 | 0.01 microfarad. |
| Condenser 84 | 120 micromicrofarads (max.). |
| Condenser 116 | 0.0047 microfarad. |
| Condenser 117 | 100 microfarads. |
| Condenser 137 | 25 microfarads. |
| Intermediate frequency | 455 kilocycles. |
| +B | 4.5 volts. |
| −B | 4.5 volts. |
| Semiconductive devices 60 and 92 | Grown-junction multiple-unit NPNPN germanium. |
| Antenna 11 | Ferramic Q ferrite core 5¾"x ¼". |
| Primary | 131 turns of 10-strand #40 single-layer celanese-covered enamelled litz wire, convolutions spaced one-wire diameter, shunted by a 220 micro-microfarad (max.) condenser. |
| Secondary | 7 turns #26 double silk-covered bare wire, wound on grounded end of core, polarity as shown. |
| Transformer 86: | |
| Primary | 120 turns of 3-strand #41 litz wire, 40/38 gears, 0.093 cam, tapped at 100 turns. |
| Secondary | 2 turns of 3-strand #41 litz wire 40/38 gears, 0.093 cam, wound on top of primary, polarity as shown. |
| Transformer 87 | Type EXO–5606 of Automatic Manufacturing Corp., Newark 4, New Jersey, designed to match impedance of 15 kilohms to 500 ohms. Secondary is bifilar wound. |
| Transformer 108 | Type EXO–5752 of Automatic Manufacturing Corp., Newark 4, New Jersey, designed to match impedance of 15 kilohms to 500 ohms. Secondary is layer wound. |
| Transformer 113 | Type EXO–5607 of Automatic Manufacturing Corp., Newark 4, New Jersey, designed to match impedance of 15 kilohms to 1.25 kilohms. Secondary is bifilar wound. |
| Transformer 119 | Type AR–103 of Argonne Electronics Manufacturing Co., 27 Thompson Street, New York, N.Y., designed to match impedance of about 20 kilohms to 2 kilohms. Secondary is center tapped. |

*Description of Fig. 5 amplifier system*

In the signal-translating circuits previously described, the common zone of the pair of transistors of the multiple-unit transistor device is maintained at a point of fixed reference potential or ground for the signals translated by both the transistors of that device. However, this may not always be necessary for predetermined ones of the alternating-current signals translated by the system. In Fig. 5, there is represented a signal-translating system or amplifier 200 for translating a signal $f_2$ of a predetermined frequency in one signal-translating or amplifier portion 201 and a second signal $f_1$ of a predetermined different frequency in another signal-translating or amplifier portion 202. The system comprises a multiple-unit transistor device 203 which includes a first transistor 204 and a second transistor 205 similar to those previously described. Device 203 includes zones 206, 207, and 208 respectively constituting the emitter, base, and collector of transistor 204 and zones 210 and 209 which, with the zone 208 common to both transistors, constitute respectively the collector, base, and emitter of transistor 205.

The signal $f_2$ is applied to the primary winding 211 of a transformer 212, one terminal of the secondary 213 thereof being connected to the base 207 of transistor 204. A suitable operating bias is applied to the base 207 by a source +B connected through a resistor 215 to the junction of the condenser 214 and the winding 213. An amplified output signal $f_2$ derived at the collector 208 of transistor 204 is applied to the primary winding 216 of an output transformer 217, one terminal of that winding being connected to the collector while its other terminal is connected to ground through a coupling condenser 218 and to a source +B′ through a resistor 219.

The signal $f_1$ is applied to the primary winding 220 of an input transformer 221, one terminal of the secondary winding 222 of which is connected directly to the base 209 of transistor 205 while its other terminal is connected through a coupling condenser 223 to the emitter 208 of transistor 205 and is also connected through a resistor 224 of high resistive impedance to a biasing source +B″. Condenser 223 is selected to serve as a by-pass condenser for both signals $f_1$ and $f_2$. This condenser prevents the signal $f_2$ appearing at the collector 208 of transistor 204 from appearing between the base 209 and the emitter 208 of transistor 205. Amplified output signals $f_1$ appearing at the collector 210 of transistor 205 are applied to the primary winding 225 of an output transformer 226. One terminal of the primary winding is connected directly to the collector 210 while its other terminal is connected to the emitter 208 through series-connected condensers 227 and 228. Condenser 227 is a coupling condenser and condenser 228 is selected to serve as a by-pass condenser for the signal $f_1$ but not for the signal $f_2$. The junction of the condensers just mentioned is connected to ground while the junction of the condenser 227 and the winding 225 is connected to a source +B‴ through a resistor 230.

It will be seen that the amplifier portions 201 and 202 are connected in the common emitter relation and thus are capable of promoting full use of the capabilities of those circuits. The amplifier portion 201 translates to its output circuit an amplified replica of the input signal $f_2$ appearing at the input terminals. Similarly, an amplified replica of the input signal $f_1$ is translated to the output circuit of the amplifier portion 202. The arrangement of the circuits which include the multiple-unit transistor device 203 is such that independent operation of the amplifier portions 201 and 202 occurs with respect to the alternating-current signals $f_1$ and $f_2$ appearing in individual ones of those amplifier portions. The grounded emitter 206 of unit 204 serves as a point of fixed reference potential for amplifier portion 201 and the potential of the collector 208 varies with reference to that fixed potential point in accordance with the variations of the signal $f_2$ applied to the input transformer 212. Since the collector of transistor 204 also constitutes the emitter of transistor 205 of unit 202 and since the condenser 228 presents a high impedance to the signal $f_2$, the common zone 208 is not at ground potential for the signal $f_2$. Therefore, a short circuit for signal $f_2$ does not appear across the primary winding 216 of transformer 217 and the amplifier portion 201 functions in the conventional manner to develop an amplified output signal across the secondary winding of transformer 217.

The condenser 228 grounds the emitter of the common emitter circuit of amplifier portion 202 for the signal $f_1$. The collector potential of transistor 205 of the amplifier portion 202 varies about ground potential in accordance with the potential variations of the signal $f_1$ applied to the input transformer 221 and produces across the secondary winding of transformer 226 an amplified version of the signal $f_1$. Thus, the condenser 228 and the grounded electrode thereof together with the grounded connection for the emitter 206 of transistor 204 constitute means in the circuits of amplifier portions 201 and 202, including a point of fixed potential for at least predetermined alternating-current signals translated by the amplifier portions, which are positioned to provide desired independent operation of the amplifier portions with respect to predetermined alternating-current signals in each of those amplifier portions. Expressed somewhat differently, the positions of the grounded connections and the proportioning of the condenser 228 permit the circuits of amplifier portions 201 and 202 to operate independently of each other in the translation of their respective signals $f_2$ and $f_1$.

While there have been described what are at present considered to be the preferred embodiments of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. A signal-translating system comprising: a multiple-unit transistor device including a pair of junction transistors which have a common zone of semi-conductive material serving as the collector of one transistor and as the emitter of the other transistor; an electrical connection to said common zone; a first signal-translating circuit including one of said transistors and a second signal-translating circuit including the other thereof, said circuits being of the common emitter type to promote full use of the capabilities of said circuits; and a condenser in said circuits and engaging said connection for maintaining said zone at a point of fixed potential for at least alternating-current signals translated by said circuits, thereby providing desired independent operation of said first and second circuits with respect to alternating-current signals in each of said circuits.

2. A signal-translating system comprising: a multiple-unit transistor device including a pair of junction transistors respectively having a base, an emitter, and a collector, the collector of the first transistor and the emitter of the second transistor sharing the same zone of semiconductive material; an electrical connection to said shared zone; a frequency converter including said first transistor and having an input circuit and an output circuit in which the emitter of said first transistor is common; an amplifier including said second transistor and having an input circuit and an output circuit in which the emitter of said second transistor is common; means for coupling the input circuit of said amplifier in cascade with the output circuit of said converter; engaging said connection for maintaining said zone at a point of fixed potential for at least alternating-current signals translated by said converter and said amplifier, thereby providing desired independent operation of said converter and amplifier with respect to alternating-current signals in each of said circuits.

3. A signal-translating system for a radio receiver comprising: a multiple-unit transistor device including a pair of junction transistors respectively having a base, an emitter, and a collector, the collector of the first transistor and the emitter of the second transistor sharing the same zone of semiconductive material; an electrical connection to said shared zone; an autodyne frequency converter including said first transistor and having an input circuit and an output circuit in which the emitter of said first transistor is common, said converter being responsive to an applied input radio-frequency signal and to local oscillations developed therein for deriving an intermediate-frequency signal; an intermediate-freqency amplifier including said second transistor and having an input circuit and an output circuit in which the emitter of said second transistor is common; means for coupling the input circuit of said amplifier in cascade with the output circuit of said converter; and means engaging said connection for maintaining said zone at a point of fixed potential for at least alternating-current signals translated by said converter and said amplifier, thereby providing desired independent operation of said converter and amplifier with respect to alternating-current signals in each of said circuits.

4. A signal-translating system for a radio receiver comprising: a multiple-unit transistor device including a pair of junction transistors respectively having a base, an emitter, and a collector, the collector of the first transistor and the emitter of the second transistor sharing the same zone of semiconductive material; an electrical connection to said common zone; an oscillator-modulator including said first transistor and having an input circuit and an output circuit in which the emitter of said first transistor is common, said oscillator-modulator being responsive to an applied input radio-frequency signal and local oscillations developed therein for deriving an intermediate-frequency signal; an intermediate-frequency amplifier including said second transistor and having an input circuit and an output circuit in which the emitter of said second transistor is common; means for coupling the input circuit of said amplifier in cascade with the output circuit of said oscillator-modulator; and means engaging said connection for maintaining said zone at a point of fixed potential for at least alternating-current signals translated by said oscillator-modulator and said amplifier, thereby providing desired independent operation of said oscillator-modulator and amplifier with respect to alternating-current signals in each of said circuits.

5. An amplifier system comprising: a multiple-unit transistor device including a pair of junction transistors which have a common zone of semiconductive material serving as the collector of one transistor and as the emitter of the other transistor; an electrical connection to said common zone; a first amplifier circuit including one of said transistors and a second amplifier circuit including the other thereof coupled in cascade with said first amplifier circuit, said circuits being of the common emitter type to promote full use of the capabilities of said circuits; and means in said circuits and engaging said connection for maintaining said zone at a point of fixed potential for at least alternating-current signals translated by said circuits, thereby providing desired independent operation of said first and second circuits with respect to alternating-current signals in each of said circuits.

6. An amplifier system comprising: a multiple-unit transistor device including a pair of junction transistors which have a common zone of semiconductive material serving as the collector of one transistor and as the emitter of the other transistor; an electrical connection to said common zone; a first amplifier circuit including one of said transistors for translating signals in a predetermined frequency range and a second amplifier circuit including the other thereof coupled in cascade with said first circuit for translating signals in said range, said circuits being of the common emitter type to promote full use of the capabilities of said circuits; and means in said circuits and engaging said connection for maintaining said zone at a point of fixed potential for at least alternating-current signals translated by said circuits, thereby providing desired independent operation of said first and second circuits with respect to alternating-current signals in each of said circuits.

7. A signal-translating system comprising: a multiple-unit transistor device including a pair of junction transistors which have a common zone of semi-conductive material constituting the collector of one and the emitter of the other of said transistors; an electrical connection to said common zone; a first signal-translating circuit including said one of said transistors and a second signal-translating circuit including said other thereof, said circuits being of the common emitter type to promote full use of the capabilities of said circuits; and means in said circuits and engaging said connection for maintaining said zone at a point of fixed potential for at least alternating-current signals translated by said circuits, thereby providing desired independent operation of said first and second circuits with respect to alternating-current signals in each of said circuits.

8. A signal-translating system for a radio receiver comprising: a multiple-unit transistor device including a pair of junction transistors which have a common zone of semiconductive material and an electrical connection thereto; a first signal-translating circuit including one of said transistors for translating an applied modulated intermediate-frequency wave signal and a second signal-translating circuit including the other thereof for translating the modulation components of said wave signal, said circuits being of the common emitter type to promote full use of the capabilities of said circuits; a detector responsive to said wave signal for deriving said components and for applying them to said second circuit; and means in said circuits and engaging said connection for maintaining said zone at a point of fixed potential for at least alternating-current signals translated by said circuits, thereby providing desired independent operation of said first and second circuits with respect to alternating-current signals in each of said circuits.

9. A signal-translating system for a radio receiver comprising: first and second multiple-unit transistor devices each including a pair of junction transistors which have a common zone of semiconductive material and an electrical connection thereto; a first signal-translating circuit including one of said transistors of said first device and a second signal-translating circuit including the other transistor thereof, said circuits being of the common emitter type to promote full use of the capabilities of said circuits; a third signal-translating circuit including one of said transistors of said second device and a fourth signal-translating circuit including the other transistor thereof, said third and fourth circuits being of the common emitter type to promote full use of the capabilities thereof; and means in said circuits and engaging said connections for maintaining said common zones at a point of fixed potential for at least alternating-current signals translated by said circuits, thereby providing desired independent operation of said circuits with respect to alternating-current signals in each of said circuits.

10. A signal-translating system for a radio receiver comprising: first and second multiple-unit transistor devices each including a pair of junction transistors which have a common zone of semiconductive material and an electrical connection thereto; a first signal-translating circuit including one of said transistors of said first device and a second signal-translating circuit including the other transistor thereof coupled in cascade with said first circuit, said circuits being of the common emitter type to promote full use of the capabilities of said circuits; a third signal-translating circuit coupled in cascade wtih said second circuit and including one of said transistors of said second device and a fourth signal-translating circuit including the other transistor thereof coupled to said third circuit, said third and fourth circuits being of the common emitter type to promote full use of the capabilities thereof; and means in said circuits and engaging said connections for maintaining said common zones at a point of fixed potential for at least alternating-current signals translated by said circuits, thereby providing desired independent operation of said circuits with respect to alternating-current signals in each of said circuits.

11. A signal-translating system for a superheterodyne radio receiver comprising: first and second multiple-unit transistor devices each including a pair of junction transistors which have a common zone of semi-conductive material and an electrical connection thereto; a first signal-translating circuit including one of said transistors of said first device and a second signal-translating circuit including the other transistor thereof, said circuits being of the common emitter type to promote full use of the capabilities of said circuits; a third signal-translating circuit including one of said transistors of said second device and a fourth signal-translating circuit including the other transistor thereof, said third and fourth circuits being of the common emitter type to promote full use of the capabilities thereof; a detector for deriving the modulation components of an applied signal; said circuits including in cascade a frequency converter and at least one intermediate-frequency amplifier, and further including at least one audio-frequency amplifier connected in cascade with said intermediate-frequency amplifier through said detector; and means in said circuits and engaging said connections for maintaining said common zones at a point of fixed potential for at least alternating-current signals translated by said circuits, thereby providing desired independent operation of said circuits with respect to alternating-current signals in each of said circuits.

12. A signal-translating system for a superheterodyne radio receiver comprising: first and second multiple-unit transistor devices each including a pair of junction transistors which have a common zone of semiconductive material and an electrical connection thereto; an autodyne frequency converter circuit including one of said transistors of said first device and responsive to an applied modulated radio-frequency signal and to local oscillations developed therein for deriving an intermediate-frequency signal; a first intermediate-frequency amplifier circuit including the other transistor of said first device coupled in cascade with said converter circuit; a second intermediate-frequency amplifier circuit coupled in cascade with said first amplifier circuit and including one of said transistors of said second device; an audio-frequency amplifier circuit including the other transistor of said second device; said circuits being of the common emitter type to promote full use of the capabilities of said circuits; a detector coupled between said second amplifier circuit and said audio-frequency amplifier circuit for deriving and applying the modulation components of said intermediate-frequency signal to said audio-frequency amplifier circuit; and means in said circuits and engaging said connections for maintaining said common zones at a point of fixed potential for at least alternating-current signals translated by said circuits, thereby providing desired independent operation of said circuits with respect to alternating-current signals in each of said circuits.

13. In a radio receiver, a signal-translating system comprising: a plurality of multiple-unit transistor devices each including a pair of junction transistors which have a common zone of semiconductive material serving as the collector of one transistor and as the emitter of the other transistor; an electrical connection to each of said common zones; a pair of signal-translating circuits for each of said devices, each circuit including one of the transistors of said each device and being of the common emitter type to promote full use of the capabilities of said circuits; means coupling said circuits in cascade; and means in said circuits and engaging said connections for maintaining said common zones at a point of fixed potential for at least alternating-current signals translated by said circuits, thereby providing desired independent operation of said circuits with respect to alternating-current signals in each of said circuits.

14. In a radio receiver, a signal-translating system comprising: a plurality of multiple-unit transistor devices each including a pair of junction transistors which have a common zone of semiconductive material serving as the collector of one transistor and as the emitter of the other transistor; an electrical connection to each of said common zones; a pair of signal-translating circuits for each of said devices, each circuit including one of the transistors of said each device and being of the common emitter type to promote full use of the capabilities of said circuits; means coupling predetermined ones of said circuits in cascade; and means in said circuits and engaging said connections for maintaining said common zones at a point of fixed potential for at least alternating-current signals translated by said circuits, thereby providing desired independent operation of said circuits with respect to alternating-current signals in each of said circuits.

15. A signal-translating system comprising: a multiple-unit transistor device including a pair of junction transistors which have a common zone of semiconductive material serving as the collector of one transistor and as the emitter of the other transistor; an electrical connection to said common zones; a first signal-translating circuit including said connection and one of said transistors and a second signal-translating circuit including said connection and the other transistor, said circuits being of the common emitter type to promote full use of the capabilities of said circuits; and means in said circuits, including a point of fixed potential for at least predetermined alternating-current signals translated by said circuits, positioned to provide desired independent operation of said first and second circuits with respect to predetermined alternating-current signals in each of said circuits.

16. A signal-translating system comprising: a multiple-unit transistor device including a pair of junction transistors which have emitter-base input electrodes and collector-emitter output electrodes, a common zone of semiconductive material serving as the emitter electrode of one of said transistors and the collector electrode of the other thereof, and an electrical connection to said zone; a first signal-translating circuit including said connection and said one transistor and a second signal-translating circuit including said connection and said other transistor; and means in said first and second circuits, including one of said output electrodes of said other transistor which is maintained at a point of fixed potential for at least predetermined alternating-current signals translated by said first and second circuits, arranged to provide desired independent operation of said first and second circuits with respect to predetermined alternating-current signals in each of said circuits.

17. A signal-translating system comprising: a multiple-unit transistor device including a pair of junction transistors which have emitter-base input electrodes and collector-emitter output electrodes, a common zone of semiconductive material serving as the emitter electrode of one of said transistors and the collector electrode of the other thereof, and an electrical connection to said zone; a first signal-translating circuit including said connection and said one transistor and a second signal-translating circuit including said connection and said other transistor; and means in said first and second circuits, including one of said output electrodes of said other transistor which is maintained at a point of fixed potential for at least predetermined alternating-current signals translated by said first and second circuits, positioned and proportioned to provide desired independent operation of said first and second circuits with respect to predetermined alternating-current signals in each of said circuits.

18. A signal-translating system comprising: a multiple-unit transistor device including a pair of junction transistors which have a common zone of semiconductive material constituting the collector of one and the emitter of the other of said transistors; an electrical connection to said common zone; a first signal-translating circuit including said one of said transistors and a second signal-translating circuit including said other thereof, said circuits being of the common emitter type to promote full use of the capabilities of said circuits; and means in said circuits and engaging said connection for maintaining said zone at ground potential for direct-current and alternating-current signals translated by said circuits, thereby providing desired independent operation of said first and second circuits with respect to at least alternating-current signals in each of said circuits.

References Cited in the file of this patent

UNITED STATES PATENTS

| | | |
|---|---|---|
| 1,999,327 | Holden | Apr. 30, 1935 |
| 2,094,470 | Roberts | Sept. 28, 1937 |
| 2,569,347 | Shockley | Sept. 25, 1951 |
| 2,595,496 | Webster | May 6, 1952 |
| 2,647,957 | Mallinckrodt | Aug. 14, 1953 |
| 2,662,976 | Pantchechnikoff | Dec. 15, 1953 |
| 2,663,806 | Darlington | Dec. 22, 1953 |